United States Patent [19]

Kaye

[11] Patent Number: 5,038,144

[45] Date of Patent: Aug. 6, 1991

[54] FOREARM MOUNTED MULTI-AXIS REMOTE CONTROL UNIT

[76] Inventor: Roger Kaye, 1020A Clayhill Rd., Fort Ann, N.Y. 12827

[21] Appl. No.: 497,130

[22] Filed: Mar. 21, 1990

[51] Int. Cl.$^5$ ............... G08C 17/00; G08C 19/02
[52] U.S. Cl. .................................. 341/176; 273/1 E; 340/706; 434/307
[58] Field of Search ............... 341/176; 455/100, 128; 340/706; 434/307; 273/1 E, DIG. 28

[56] References Cited

U.S. PATENT DOCUMENTS

| | | | |
|---|---|---|---|
| 3,280,991 | 10/1966 | Melton et al. | 414/5 |
| 4,046,262 | 9/1977 | Vykukal et al. | 414/5 |
| 4,491,325 | 1/1985 | Bersheim | 273/DIG. 28 |
| 4,754,268 | 6/1988 | Mori | 340/706 |

OTHER PUBLICATIONS

Instructions for Nintendo/Mattel POWER GLOVE, copyright 1989, by Mattel.

*Primary Examiner*—Glen R. Swann, III
*Attorney, Agent, or Firm*—Schmeiser, Morelle & Watts

[57] ABSTRACT

A remote control device is designed to be worn on one arm and operated by movements of a single hand. The device includes a forearm section and a pivotally connected hand section. The device is capable of providing up to 8 channels of individual controls. Both radio transmission and wire transmission capabilities are disclosed. The device includes switches that can be actuated by hand movements in either of two axes and also by a rotary movement of the hand relative to the forearm.

11 Claims, 4 Drawing Sheets

FOREARM MOUNTED MULTI-AXIS REMOTE CONTROL UNIT

FIELD OF THE INVENTION

The invention is in the field of remote control units. More particularly, the invention is in the field of arm mounted remote control units that include multi-axis signal switches.

BACKGROUND OF THE INVENTION

A remote control unit allows an operator to control the movements of a device or object from a distance. Remote control units range in complexity from a string attached to a kite to laser or radio control of exploratory spacecraft.

In the field of motor-driven model vehicles, early remote control units were directly wired to the moving vehicle. The operator could only control a small number of the vehicle's functions such as speed and direction. These remote control units were simple to use and manufacture, but the wire connecting the vehicle to the controller greatly restricted the vehicle's movements. The wire would often become tangled about stationary objects or about the vehicle itself. To be workable, the wire had to be of a relatively short length which greatly restricted the range and speed of the controlled vehicle.

Remote radio control solved the above problems. The only limits placed on the operator were the range of the radio waves and the amount of information that they could carry to the vehicle. Early types of radio remote controls utilized basically an on-off pulse transmission and this limited the number of different vehicle functions that the operator could control.

As radio remote control technology improved, the operator's control of the vehicle became greatly enhanced. Proportional control of the vehicle was made possible by digitizing the transmission wave. This allowed simple multi-channel control of the model vehicle with the operator having the ability to vary the rate or extent of each control function. Since the digital pulses are of millisecond duration, multi-channel control transmissions can be made substantially simultaneously.

A common remote control unit for a model aircraft will include two control sticks, a battery and a transmitter. The controller will have up to 8 channels of control i.e.-it will be able to control up to 8 different aircraft functions. For example, each of the control sticks will include two axes of operation. The first control stick might operate the plane's elevator surfaces by stick movement in the "y" axis and operate the plane's ailerons by movement along the "x" axis. The other control stick can operate the plane's rudder by movement in the "x" -axis and the plane's engine speed by movement in the "y" - axis. The above noted controls would require four channels and would provide the operator with what is referred to as "full house" control of the model. The controller may also include an additional four control channels which can, for example, be used to cause the retraction or extension of landing gear, activate running lights, actuate flaps for extra lift and release simulated bombs.

Most remote controls also include trim controls for each of the four main channels. These controls enable the operator to "zero" the centerpoint of each of the control channels. For example, with a model plane, an operator would want the plane to fly steady and level when none of the control stick are moved from their center origin position. He or she would adjust the trim control for each channel to attain this operation. Once each channel has been trimmed, movement of a control stick away from its centerpoint would cause the plane to deviate from its steady and level flight. This allows the operator to "fly" the plane without constantly moving the control sticks.

In controlling an airplane with the remote control described, one can adjust the plane's pitch by moving the first control stick in the "y" - axis. The Plane can be made to roll by moving the first control stick in the "x"-axis. The yaw of the plane would be adjusted or controlled by moving the second control stick along the x-axis. Moving the second control stick in the "y"- axis can change the engine speed from full throttle take-off power down to low speed cruising power. Once the trim controls are properly adjusted, the operator can temporarily remove his or her hands from the controller without incident. When all eight channels are used, the operator of the remote control unit can closely simulate piloting of an actual aircraft.

Prior art radio remote controls, while being an enormous step forward from their hard or direct wired predecessors, still suffer from a number of shortcomings. The control sticks are unlike the actual controls found in most airplanes. The controllers require two handed operation when multiple channels are used. The units are cumbersome and can be inadvertantly dropped and thereby damaged. Also, a great deal of practice is required to properly coordinate the control stick movements with the plane's movements.

The instant invention while directed to the area of radio remote controls, is also applicable to video game controls. In a video game, the operator remotely controls the movements of a pictured object such as a person, plane, car, etc.. A video game remote controller is directly wired to the video game unit and normally comprises a single joystick. The joystick, like the control stick used in a radio remote control unit, is capable of moving in both the "x" and "y" axes. In addition, the video game controller will often include a "fire" button which can, for example, make the depicted object fire a gun.

Video game controllers suffer from many of the same problems experienced by the early type of remote control units. The wiring between the control unit and the game unit greatly limits the movements of the operator. The amount of information that can be transmitted is small thereby limiting the amount of control the operator has over the pictured object.

The same problems that are experienced with the control sticks of modern radio remote controls are also common to video game joysticks. In addition, the nature of video games requires extremely rapid maneuvering of the joystick. However, rapid movement of a joystick is difficult since the human arm does not naturally move in such a manner.

As a result, modern video game controllers limit the speed at which an operator can respond to a game condition. In addition, the controllers can also cause muscle strain and physical discomfort.

In an effort to overcome the problems noted with video game controllers, a new style of controller has been recently marketed. The controller includes a glove portion worn by the operator and a movement sensing portion that is located adjacent the video screen. The glove portion includes a transmitter that directs a beam-like signal along the gloves longitudinal axis. As the glove is moved, the signal shifts and this shifting signal is detected by the remotely located movement sensing portion. In this manner, the apparatus can send a signal to the video game that corresponds to a hand movement of the operator.

This system suffers from a number of drawbacks. The user is connected to the game by a wire. The controller is extremely complicated and requires two distinct units that are required to be separated. Most importantly, this system requires an initial centering (initializing) procedure that must be frequently repeated during the game. Since the movement sensing portion is separated from the glove portion, the operator must orient the system to his or her location. During the game, any change in location, whether on purpose or inadvertant, will require a reorientation of the movement sensing portion. In practice, the operator points his or her hand at the center of the screen and then presses a button on the glove portion. This locates the glove relative to the movement sensing portion. Any deviation from this center position will cause a control signal to be sent to the game to thereby change the movement of the pictured object. As the operator's arm tires, the center position becomes harder to sustain and soon requires a reorientation procedure to be accomplished.

SUMMARY OF THE INVENTION

The invention is an arm mounted, multi-axis remote control unit. The unit comprises a forearm mounted section and a hand engaging section. With the unit attached to one arm, the operator can move the hand of that arm in a natural manner, and in the process, actuate a plurality of signal switches.

The interior of the forearm section is arcuately shaped to conform to the contours of a forearm. The forearm section includes retaining straps and may have a quantity of foam padding on its interior surface to prevent abrasion of the operator's skin. In the preferred embodiment, the forearm section comprises a rigid shell in the shape of a half-tube. The shell is placed on either a top or side portion of the user's forearm.

Located on a top portion of the shell is a transmitter for sending control signals to the device being controlled. When used for radio control, the transmitter will have an attached power supply and antenna. For video game applications, the remote control unit may employ a radio transmitter as described above with a receiver located at the game unit. Alternately, the remote control unit can be hard wired to the game apparatus. For the latter situation, the transmitter may simply be a wiring harness leading to the video game.

Three embodiments of the invention are described. The first is a two channel unit which is actuated by a finger movement and/or by a vertical wrist rotation. The second embodiment is again a two channel unit which is operated by a finger movement and/or a wrist movement. However, in this second embodiment, a horizontal wrist rotation is used to actuate the control switch. The third embodiment is the most versatile and full featured of the embodiments.

With the third embodiment, the user can control up to 8 channels with a single hand. The user can pivot his or her hand both vertically and horizontally and actuate two separate proportional control switches. The device also includes a proportional control switch that can be actuated by the user rotating his or her hand about the arm's longitudinal axis i.e.—a rolling movement. In addition, the unit includes a finger operated trigger and a thumb operated joystick. Finally, the unit includes two buttons that can be pressed by the thumb and four finger operated rotary switches. The latter switches can be used to adjust the trim of the four main channels.

A first object of the invention to provide a multi-channel remote control unit that can be operated by just one hand.

A second object of the invention is to provide a remote control that is not sensitive to a user's location.

A third object of the invention is to provide a remote control unit in which switches are actuated by normal movements of the user's arm. In this way, a more ergonomic unit is provided.

A fourth object is to provide a unit that can be operated while one's body is in a relaxed position. The instant invention is capable of being operated while the user has his or her arm in any comfortable orientation.

A fifth object is to provide a unit whose operation is easy to learn. For example, when the third embodiment is used to control a model plane, downward pointing of a hand causes the plane to dive (pitch down). Turning a hand to the side creates a turning action (yaw) in the aircraft. A rolling hand movement causes a similar rolling movement of the plane.

BRIEF DESCRIPTION OF THE DRAWINGS

FIG. 1 is a perspective view of the first embodiment of the invention.

FIG. 2 is an elevational view of the second embodiment of the invention.

FIG. 3 is a bottom view of the device of FIG. 2.

FIG. 5 is a left-side view of the third embodiment of the invention.

FIG. 6 is a front view of the third embodiment of the invention.

FIG. 7 is a side view showing a portion of a transmitter housing with wires leading away from the housing.

DETAILED DESCRIPTION OF THE DRAWINGS

Figure 4:
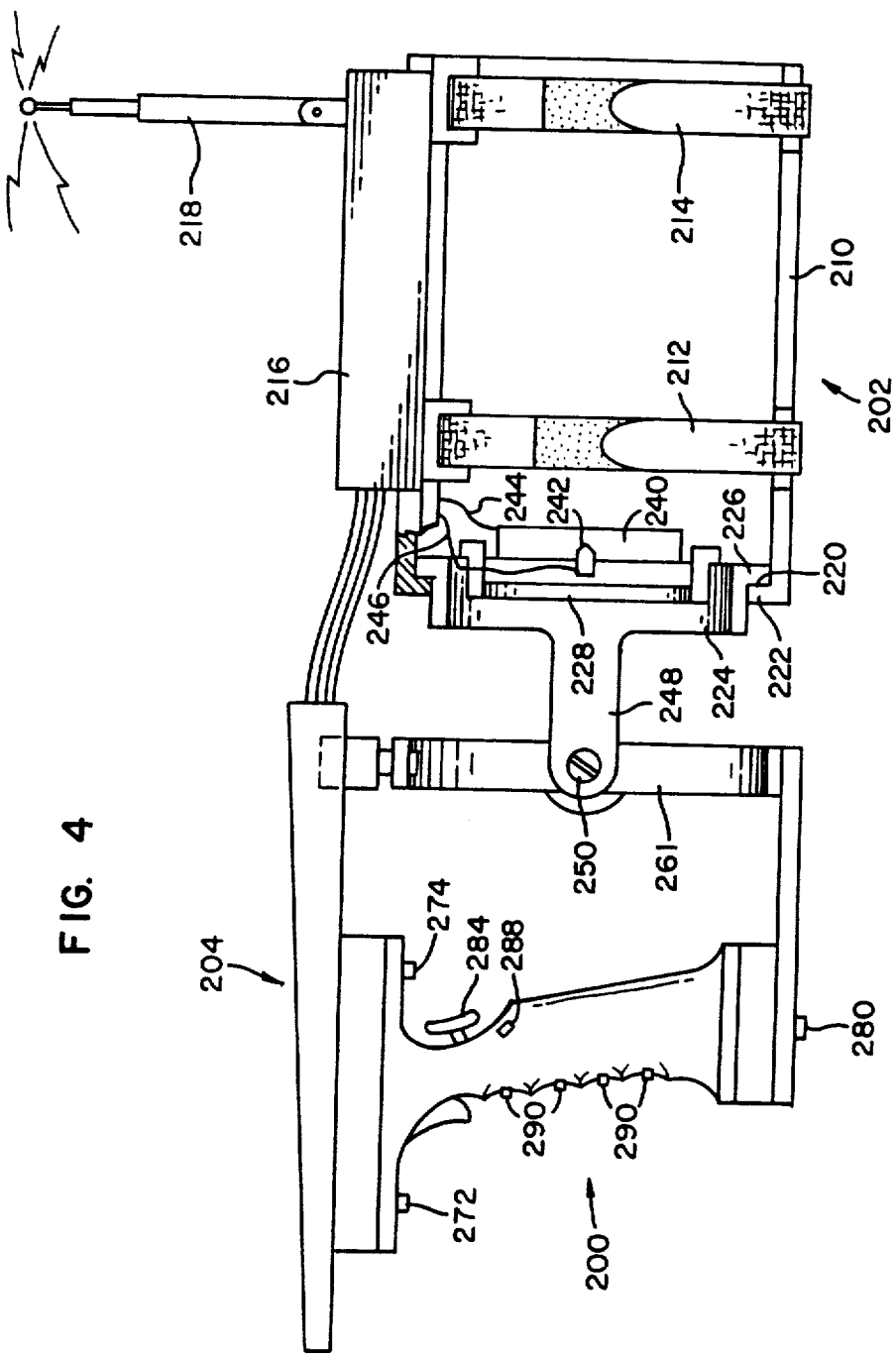
FIG. 4 is a right-side view of the third embodiment of the invention.

FIG. 1 is a perspective view of a first embodiment of the invention. The remote control unit 1 comprises a forearm mounted section 2 and a hand engaging section 4. The two sections are pivotally connected by pivot pins 6.

The forearm section 2 includes a rigid shell 10 that is tube shaped and is open at its bottom. Extending from the bottom of the shell are a pair of retaining straps 12 and 14. On the top of the shell is located a proportional control switch 16. Extending upwardly from the switch is a toggle 18. As can be seen, the toggle movement is along an axis that is parallel to the longitudinal axis of the shell 10.

Surrounding the switch 16 and extending rearwardly therefrom is a housing unit 20. Atop the housing is partially shown an antenna 22. Within the housing unit is a transmitter (not shown), battery power pack (not shown) and on-off switch (not shown).

Linking the forearm section 2 and hand section 4 is a rod 24. The rod is pivotally engaged at one end to the toggle 18 by a pivot pin 26. At the other end of the rod, it is pivotally engaged to a vertical foundation 30 by a pivot pin 32.

The foundation 30 is located on a mount 34 which is attached to a rigid, tube-like shell 36. At the front of the shell 36 there is a forward projection 38 which includes a horizontally projecting grip 40. At the very end of the projection 38 is located a finger operated proportional control switch 42 that includes a finger receiving toggle 44. Extending from the switch 42 back to the housing 20 is a connecting wire 46.

In operation, one would place the device on an arm with shell 10 located atop the forearm and one's hand atop the grip 40. In this position, the pivots 6 would be located either even with or rearward of one's wrist joint. The operator would snug down the straps 12 and place an index finger into the toggle 44. By rotating his or her hand vertically relative to the forearm portion 2, switch 16 is actuated. By moving the index finger forward or back (horizontally), switch 42 is actuated. Each of the switches is wire linked to the transmitter, and upon switch actuation, a signal is transmitted from the antenna to the controlled device. Therefore, once the unit is mounted and turned on, it allows the operator two channels of operation that respond to two different axes and types of user movement.

FIG. 2 shows a side, elevational view of the second embodiment of the invention. The remote control unit 100 includes a forearm section 102 and hand section 104. As in the first embodiment, the forearm unit includes a rigid shell 106 that has an arcuately shaped interior. Extending downwardly from the rear of the shell is a retaining strap 108. Extending radially downward from a forward portion of the shell is an arcuately shaped positioning member 110. Atop the shell is a housing unit 112 having an antenna 114 and an internal power pack (not shown), transmitter (not shown) and on-off switch (not shown).

Extending forwardly from the shell 106 and positioning member 110 are a pair of bar members 116 and 118 respectively. Pivotally attached to the forward ends of each of the bar members is the hand section 104.

The hand section 104 includes a top portion 130 and grip portion 132. The grip portion, at its base, includes a rearwardly extending bar 134 that is pivotally connected at its rearward end to bar member 118. A pivot pin 136 and securing nut 138 are used to form the pivotal connection. The top portion 130 is pivotally connected to bar member 116 by a rotary proportional signal switch 140. This switch provides both a pivotal connection and a channel control. The bottom of the switch includes a retaining nut 142.

At the forward end of the top portion is located a proportional finger operated control switch 144. Extending downwardly from the switch is a shaped toggle member 146.

Also connecting the hand and forearm sections is a wiring harness 148. The wiring harness is sized to allow the pivotal movement of the hand section relative to the forearm section.

FIG. 3 provides a bottom view of the second embodiment of the invention. The above noted pivotal movement of the hand section is shown in phantom. A second retaining strap 150 can also be seen.

In operation, the unit is placed on top of a forearm with the grip 132 located adjacent the user's palm. The retaining straps 108 and 150 are secured and the index finger is placed into toggle 146. Once secured and positioned, the two pivots (140,138) will be located even with or rearwards of the user's wrist joint.

With the unit's power switch in the on position, the user is able to transmit control signals on two channels. Forward or rearward movement of the index finger actuates switch 144. Side to side pivotal movement of the user's hand actuates switch 140. Each of the switches is wired to the transmitter and actuation of either switch causes an appropriate signal to be transmitted. In this unit, multi-channel control is accomplished with the single axis trigger and the pivotal wrist control.

FIG. 4 shows a right side view of a third embodiment of the invention.

The remote control unit 200 comprises a forearm section 202 and hand section 204. As in the previous embodiments, the forearm section includes a rigid, arcuately shaped shell 210. The interior of the shell is arcuately contoured to fit a forearm. The shell is in the shape of a half circle and includes a pair of retaining straps 212 and 214 attached to its top and bottom edge.

Located on a top portion of the shell is a housing unit 216. Within the housing unit is a transmitter (not shown), power supply (not shown) and on-off switoh (not shown). Atop the housing unit is a pivotally attached antenna 218.

The forward portion of the shell includes a rotary bearing portion 220. The bearing portion includes at its forward edge an inwardly extending lip 222. Slidably engaged to the bearing portion is a semi-circular member 224. The outer surface of member 224 has an identical curvature to that of the bearing surface that it is in contact with. The member includes at its rearward end an outwardly extending lip 226. Once in position, the extending lips 222 and 226 are adjacent each other. A "U"-shaped keeper 228 is used to maintain the sliding contact between member 224 and the bearing portion 220. The base of the "U" is semi-circular in shape and has an identical curvature to that of member 224. The keeper is fastened to the shell at its ends by fasteners (not shown). Located adjacent the bearing surface of the shell is a resistive strip 240. In sliding electrical contact with the strip and attached to member 224 is a contact pin 242. Attached to the pin and strip are wires 244 and 246 which extend to a computer circuit within the transmitter. The pin and strip form a rheostat type of variable resister which has the ability to provide a proportional signal that is related to the position of member 224 relative on the shell.

Extending forwardly from the circular member 224 is an arm 248. Pivotally connected to the forward end of the arm is the hand section 204. A pivot pin 250 is used to make the connection.

FIG. 5 shows a left side view of the third embodiment of the remote control unit and FIG. 6 shows a front view of the same unit. In these views, rotary proportional control switch 260 can be seen at the pivotal attachment point between arcuate member 261 and arm 248. This rotary switch is actuated by relative pivotal movement between the arcuate member and arm. This is accomplished by rigidly connecting an outer portion of the switch to the member 261 and connecting an internal, rotatably connected switch portion to the pivot pin 250.

The member 261 is pivotally connected to a grip 262 by bottom rod 264 and housing 268. A pivot pin 270 connects the member 261 at its base to the rod 264. At the top of the member 261, a rotary proportional control switch 270 is used for the pivotal connection. The control switch has one portion rigidly connected to the housing 268 and another rotatable portion connected to the member. In this manner, side to side pivoting of the grip relative to member 261 actuates the switch 270. This is similar to switch 140 of the second embodiment.

The grip 262 is adjustably fastened to the housing 268 by screws 272 and 274. These screws fit through slots (not shown) located in the top horizontal legs 276 and 278 of the grip member.

At its base, the grip 262 is adjustably attached to rod 264 by screw 280. The rod includes a longitudinally extending slot (not shown) through which the screw extends. Once the fastening screws (272,274,280) are loosened, the grip may be moved forward or rearward since the screws can slide within their associated slots. Tightening of the screws locks the grip in place by causing the head of each screw to contact the material adjacent the associated slot.

The grip includes a plurality of controls. There is a trigger 282 which may actuate an internal switch that is either of the proportional type (to control throttle, for example) or on-off type (ex. to shoot a gun). The rear portion of the grip includes a thumb operated joystick 284. The joystick operates in two axes in a manner similar to a video game joystick or the control stick of a radio type remote control.

Adjacent each side of the joystick are two buttons 286 and 288. These buttons can be used to transmit control instructions on two additional channels. For example, when controlling a model plane, one button can actuate the landing gear and the other button can extend or retract landing flaps.

In FIG. 6, the front of the grip can be seen to include four rotary switches 290. These switches can be used to adjust the trim of four control channels in the same manner as used on the previously described prior art radio control units.

Each of the channel controlling switches is wired to the transmitter and the transmitter would be wired to the power supply and antenna. Each individual trim switch is directly wired to the individual control switch that it adjusts.

In operation, the forearm section 202 is secured to the outer side of the operator's forearm with the arcuate member 261 adjacent the wrist joint. If required, the grip is adjusted forward or rearward until it comfortably fits into the user's palm.

The operator can then rotate the grip sideways about its midpoint to actuate proportional switch 242,244. As pin 242 moves with member 224, it travels along strip 240. A circuit is made starting at wire 246, through the conducting pin 242, down to the strip, and then through the strip and into wire 244. As the pin moves further away from the wired end of the strip, the resistance through the strip is increased. This changeable resistance locates the member 224 relative to shell 210. Due to the complimentary curvatures of member 224 and shell 210, the member smoothly slides within the shell in a radial manner about the shell's longitudinal axis. When flying a model airplane, this switch would control the alterons and rolling of the hand to either side would cause a similar rolling action in the airplane.

Pivoting the grip up or down would actuate proportional switch 260. When controlling an airplane, the switch would operate the elevator surfaces and pointing one's hand down would cause the plane to dive.

A side to side pivoting of the grip would actuate proportional switch 270. This switch could operate a model airplane's rudder and in this way, pointing a hand to either side would control the plane's yaw in which the plane's nose would be angled to the right or left.

Use of a proportional switch for trigger 282 would provide the user with a switch that could control a model airplane's throttle. Using the above mentioned four proportional controls, an operator would have "full house" control of a model airplane.

The joystick 284 can be used to control a separate model or, when controlling a model plane, the joystick can be used to position a gun turret or similar rotatable member.

All of the described embodiments include a forearm section and hand section. Even though each embodiment was described separately, various features from each embodiment can be combined or exchanged and still provide the basic invention. For example, the rod actuation of the proportional switch used in the first embodiment can replace the rotary switch (260) used in the third embodiment. The grip and associated controls of the third embodiment can be substituted for the grip used in the second embodiment. Also, the third embodiment includes controls for eight operating channels. If fewer channels are required, various of the controls can be deleted from the device and an improved controller would still result. Additional control channels can be added to each embodiment by increasing the number of switches located on the hand section.

In all of the embodiments, padding can be added wherever the device would contact a user's skin to provide a comfortable fit and to reduce the chance of injury. The rigid shell can be made of any rigid material such as metal or plastic. Plastic is preferred due to its low weight and moderate cost.

The embodiments shown in the drawings all feature transmitter units and antennas. The invention is not limited to radio control applications. Each of the controllers can be directly wired to the device to be controlled. In this way, the instant invention could be used to replace standard video game controllers. FIG. 7 shows the end of a housing (216,112,20) that is generic to the three embodiments and in which the antenna has been replaced by a wiring harness 296. The harness would extend to the device being controlled. An internal power supply would not be required.

It should be noted that, save for the rotary switch (240,242) of the third embodiment, all of the electrical components are common off-the-shelf parts normally used for radio control applications. The rotary switch (240,242) is specifically described in one embodiment. However, rotary switches are well known in the variable resistor field and other embodiments of the switch can be made using common components that will provide a similar function.

Lastly, it is pointed out that any of the embodiments can be used on either a left or right arm. If desired, a user can mount one remote control unit on each arm and thereby control two different vehicles or objects or control 16 or more functions of a single controlled device.

The embodiments disclosed herein have been discussed for the purpose of familiarizing the reader with the novel aspects of the invention. Although preferred embodiments of the invention have been shown and described, many changes, modifications and substitutions may be made by one having ordinary skill in the art without necessarily departing from the spirit and scope of the invention.

I claim:

1. A remote control unit comprising:
   a rearward unit including means for securely and removably attaching said rearward unit to a user's forearm;
   a forward unit connected to said rearward unit, said forward unit including hand engaging means for engaging a hand connected to said forearm;
   at least three movement operated switch means operatively connected to said forward unit whereby when said control unit is mounted on the arm of a user, said three switch means can be actuated independently or simultaneously by movements associated with the hand to which the forward unit is engaged relative to the rearward unit; and
   a transmission means operatively connected to said switch means for transmitting signals to an object that is to be remotely controlled, said signals resulting from actuation of any of said switch means.

2. The unit of claim 1 wherein when the unit is mounted on the arm of a user, a first of said switch means can be actuated by rotating the hand to which the forward unit is engaged, said rotation being about longitudinal axis, said longitudinal axis being parallel to a longitudinal axis of said forearm.

3. The unit of claim 2 wherein when the unit is mounted on an arm of a user, a second of said switch means can be actuated by pivoting the hand to which the forward unit is engaged in a first axial direction that is substantially perpendicular to a longitudinal axis of said forearm.

4. The unit of claim 1 wherein said transmission means comprises a radio transmitter.

5. The unit of claim 1 wherein said transmission means comprises a plurality of wires connecting said remote control unit to the object being controlled.

6. The unit of claim 1 wherein said rearward and forward units are configured whereby said unit can be placed on either a right or left arm of a user.

7. The unit of claim 1 wherein at least one of said switch means is of the proportional type whereby different amounts of movements create proportionally different actuations of said switch means.

8. A remote control unit comprising:
   a first portion including means for removably mounting said first portion on a user's forearm;
   a second portion operatively connected to said first portion and including engagement means for engaging a user's hand which is on the same arm to which the first portion would be mounted;
   controller means operatively connected to said engagement means and which is actuated by movement of a hand to which the second portion is engaged, said movement being relative to the forearm to which the first portion is engaged and wherein the controller means includes at least three switch means that can be actuated either independently or simultaneously wherein a first of said switch means can be actuated by moving said hand relative to said forearm in a first direction, a second of said switch means can be actuated by moving said hand relative to said forearm in a second direction, and a third of said switch means can be actuated by a rotary movement of said hand; and
   transmitting means connected to either of said portions for transmitting signals caused by actuation of said controller means to a unit controlled by said remote control.

9. The device of claim 8 wherein the transmitting means transmits radio waves.

10. The device of claim 8 wherein the second portion comprises a grip means and a trigger means, said trigger means being operatively engaged to a fourth switch means which, when actuated by a finger moving said trigger means, also sends a signal to said transmitting means for initiating an action in the unit controlled by said remote control.

11. A remote control unit for controlling a remotely controlled device, said remote control unit comprising:
    a forearm receiving portion having an arcuate interior shape for receiving a forearm and including securing means for removably securing said portion to a forearm of a user;
    a hand engaging portion pivotally connected to said forearm receiving portion, said hand engaging portion including a gripping means which can be gripped by a user's fingers, said fingers being on the same arm to which the forearm receiving portion would be attached;
    a first switch means operatively connected to both the forearm receiving portion and the hand engaging portion, wherein said first switch means can be actuated by pivotal movement of one of said portions relative to the other of said portions;
    a second switch means operatively connected to said gripping means wherein said second switch means can be actuated by movement of one of said fingers which can be gripping said gripping means;
    a third switch means operatively connected to both the forearm receiving portion and the hand engaging portion, wherein said third switch means can be actuated by a pivotal movement of one of said portions relative to the other of said portions said pivotal movement being in a different direction from the pivotal movement that actuates said first switch means;
    a fourth switch means operatively connected to both the forearm receiving portion and the hand engaging portion, wherein said fourth switch means is actuated by a rotary movement of said hand engaging portion relative to said forearm receiving portion; and
    a transmitting means connected to said first, second, third and fourth switch means and located on one of said portions for transmitting signals caused by actuation of any of said switch means to the device being controlled by the remote control unit.

* * * * *

UNITED STATES PATENT AND TRADEMARK OFFICE
CERTIFICATE OF CORRECTION

PATENT NO. : 5,038,144

DATED : August 6, 1991

INVENTOR(S) : Roger Kaye

It is certified that error appears in the above-identified patent and that said Letters Patent is hereby corrected as shown below:

The title page should be deleted to appear as per attached title page. Sheets 1 of 4 through 4 of 4 consisting of figures 1-7 should be added as shown on the attached sheets.

Signed and Sealed this

Thirteenth Day of October, 1992

Attest:

DOUGLAS B. COMER

*Attesting Officer*   *Acting Commissioner of Patents and Trademarks*

United States Patent [19]

Kaye

[11] Patent Number: 5,038,144

[45] Date of Patent: Aug. 6, 1991

[54] FOREARM MOUNTED MULTI-AXIS REMOTE CONTROL UNIT

[76] Inventor: Roger Kaye, 1020A Clayhill Rd., Fort Ann, N.Y. 12827

[21] Appl. No.: 497,130

[22] Filed: Mar. 21, 1990

[51] Int. Cl.$^5$ .................. G08C 17/00; G08C 19/02
[52] U.S. Cl. ................... 341/176; 273/1 E; 340/706; 434/307
[58] Field of Search ............ 341/176; 455/100, 128; 340/706; 434/307; 273/1 E, DIG. 28

[56] References Cited

U.S. PATENT DOCUMENTS

| | | | |
|---|---|---|---|
| 3,280,991 | 10/1966 | Melton et al. | 414/5 |
| 4,046,262 | 9/1977 | Vykukal et al. | 414/5 |
| 4,491,325 | 1/1985 | Bersheim | 273/DIG. 28 |
| 4,754,268 | 6/1988 | Mori | 340/706 |

OTHER PUBLICATIONS

Instructions for Nintendo/Mattel POWER GLOVE, copyright 1989, by Mattel.

*Primary Examiner*—Glen R. Swann, III
*Attorney, Agent, or Firm*—Schmeiser, Morelle & Watts

[57] ABSTRACT

A remote control device is designed to be worn on one arm and operated by movements of a single hand. The device includes a forearm section and a pivotally connected hand section. The device is capable of providing up to 8 channels of individual controls. Both radio transmission and wire transmission capabilities are disclosed. The device includes switches that can be actuated by hand movements in either of two axes and also by a rotary movement of the hand relative to the forearm.

11 Claims, 4 Drawing Sheets

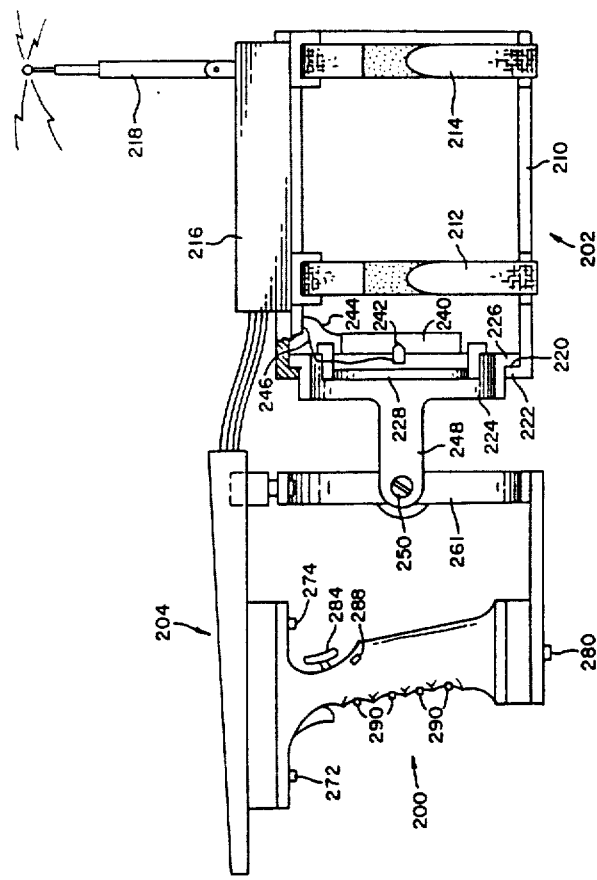

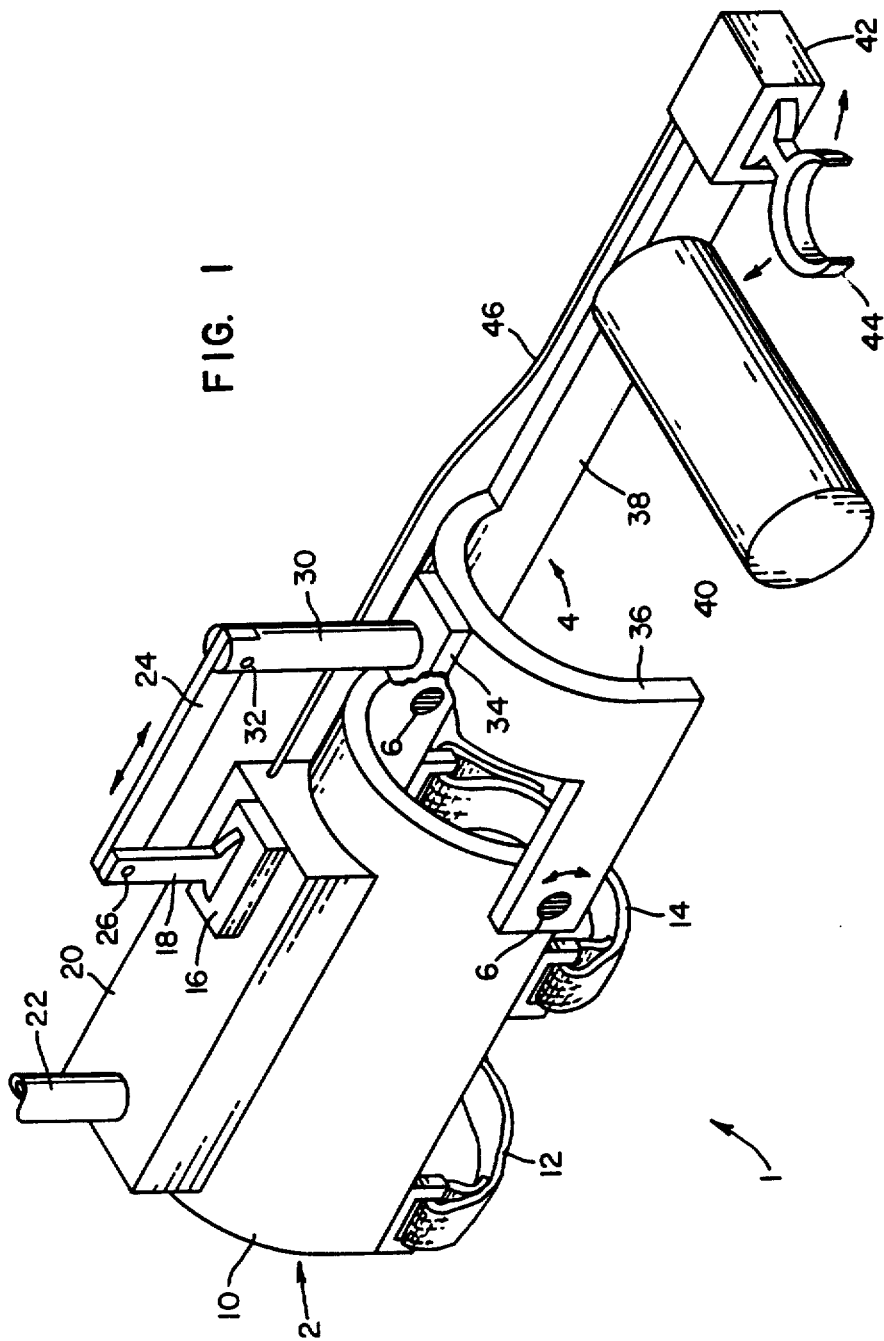

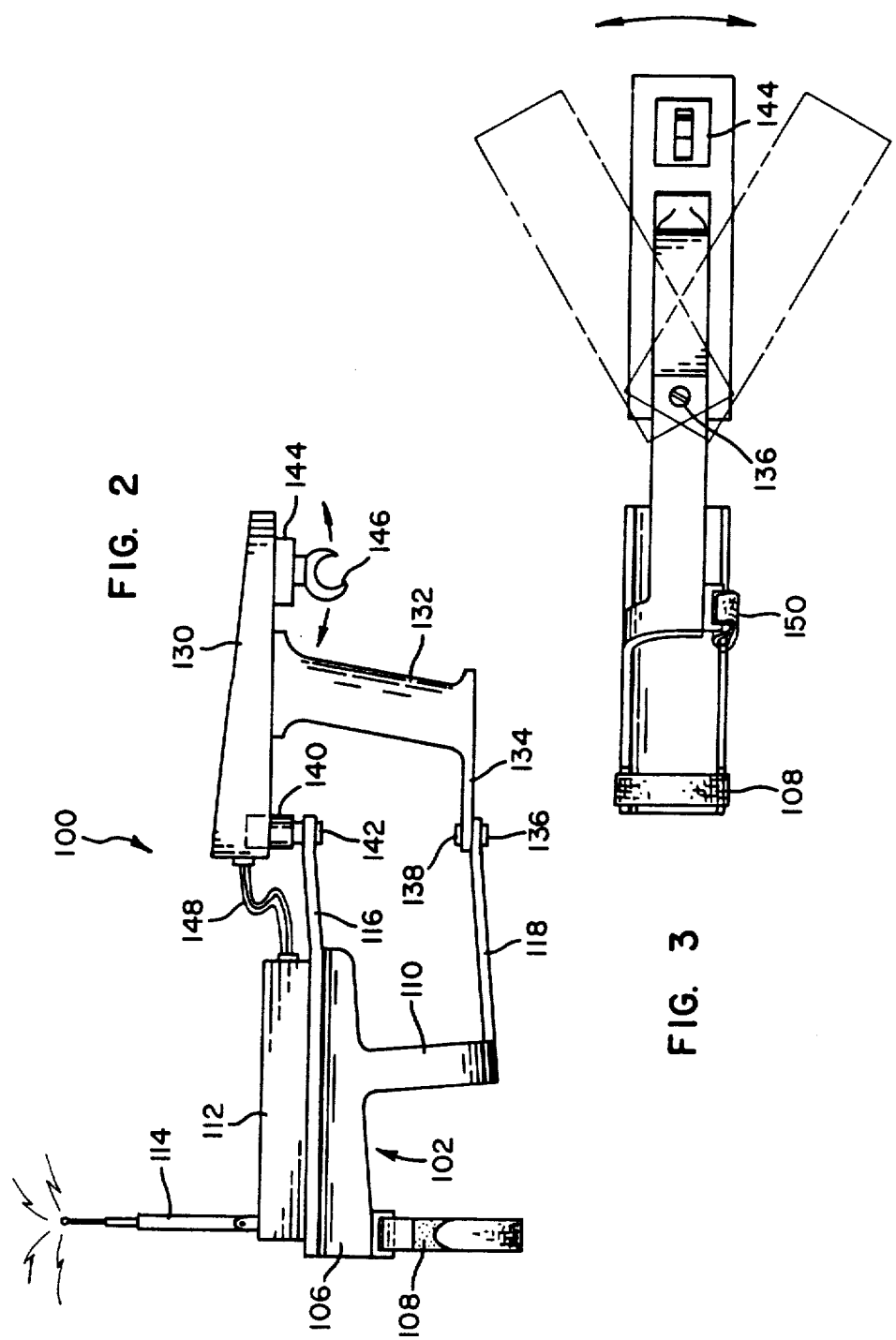

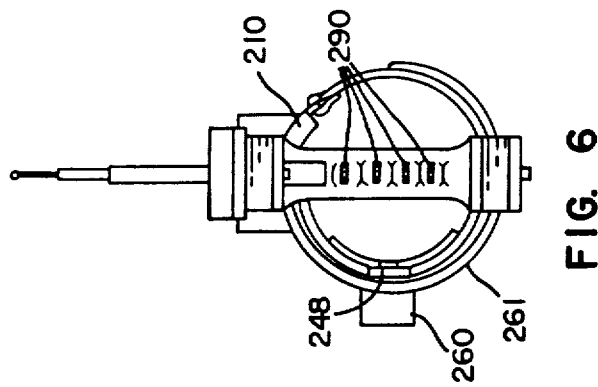
FIG. 6
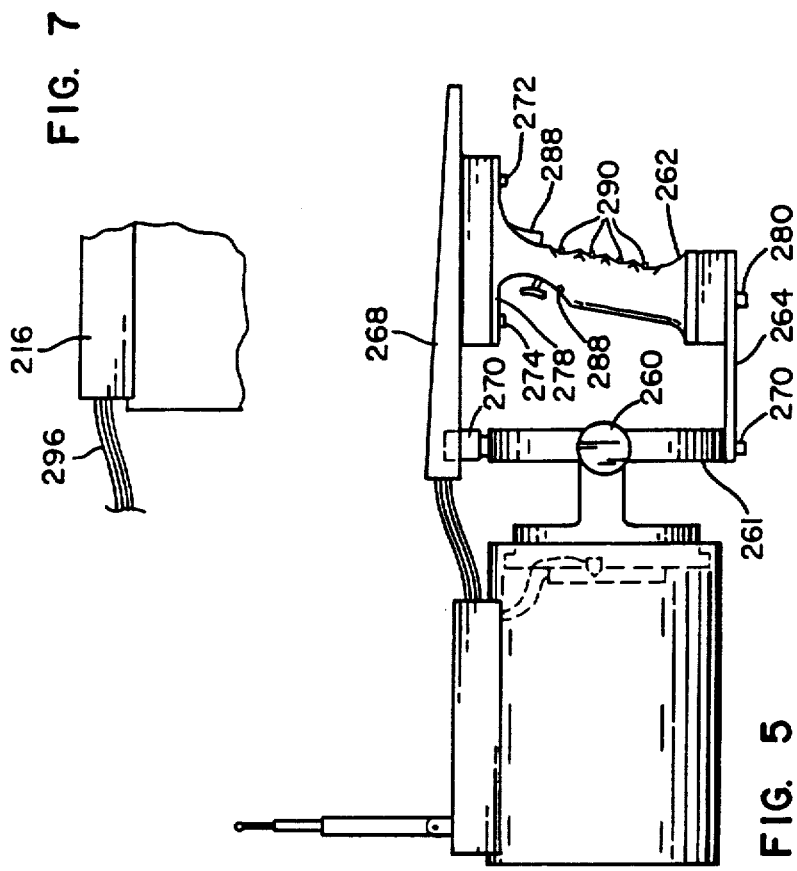
FIG. 7
FIG. 5